(12) United States Patent
Mima

(10) Patent No.: US 10,161,984 B2
(45) Date of Patent: Dec. 25, 2018

(54) SOLENOID CONTROL APPARATUS AND DIAGNOSIS METHOD

(71) Applicant: Toyota Jidosha Kabushiki Kaisha, Toyota-shi, Aichi-ken (JP)

(72) Inventor: Hiroki Mima, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 15/702,256

(22) Filed: Sep. 12, 2017

(65) Prior Publication Data

US 2018/0088166 A1 Mar. 29, 2018

(30) Foreign Application Priority Data

Sep. 27, 2016 (JP) .................. 2016-188553

(51) Int. Cl.
*G01R 31/06* (2006.01)
*B60T 17/22* (2006.01)
*F16K 37/00* (2006.01)
*G01R 31/00* (2006.01)

(52) U.S. Cl.
CPC ........... *G01R 31/06* (2013.01); *B60T 17/221* (2013.01); *F16K 37/0041* (2013.01); *G01R 31/006* (2013.01)

(58) Field of Classification Search
CPC ... G01R 31/006; G01R 31/06; F16K 37/0041; B60T 17/221
USPC ........ 324/200, 378, 388, 118–143, 435, 500, 324/546, 723, 714, 74, 103 R, 114; 361/167, 168.1, 169.1, 191, 139; 701/29, 701/36, 146.2; 702/1, 182–183
See application file for complete search history.

(56) References Cited

U.S. PATENT DOCUMENTS

2001/0006306 A1* 7/2001 Kagawa ................. B60T 8/367
303/20
2015/0204931 A1* 7/2015 Scholl ....................... B60T 8/36
324/503

FOREIGN PATENT DOCUMENTS

JP 2010-070139 A 4/2010

* cited by examiner

*Primary Examiner* — Melissa Koval
*Assistant Examiner* — Trung Nguyen
(74) *Attorney, Agent, or Firm* — Dinsmore & Shohl LLP

(57) ABSTRACT

A solenoid is determined abnormal if a current flowing therethrough at a certain duty ratio falls within an abnormal range. After the abnormal determination, a first duty ratio is used to cause a current to flow through the solenoid at such a current value within a first range as to not drive the solenoid valve. The solenoid is determined provisionally normal if the current at the first duty ratio falls within the first range. After the provisionally normal determination, a second duty ratio is used to cause a current to flow through the solenoid at such a current value within a second range including a current value range greater than the first range as to drive the solenoid valve. The solenoid is determined normal if the current at the second duty ratio falls within the second range.

12 Claims, 7 Drawing Sheets

SOLENOID CONTROL APPARATUS AND DIAGNOSIS METHOD

CROSS-REFERENCE TO RELATED APPLICATIONS

The present application claims priority to Japanese Application No. 2016-188553, filed on Sep. 27, 2016, the entire contents of which are hereby incorporated by reference.

BACKGROUND

1. Technical Field

The present disclosure relates to a solenoid control apparatus and a diagnosis method.

2. Description of the Related Art

A technology has been known in which, in a brake apparatus, it is determined whether a solenoid in a solenoid valve is abnormal or normal by flowing a current therethrough having such a relatively small current value as to not drive the solenoid valve (for example, see Japanese Laid-Open Patent Application No. 2010-70139). According to the technology, a transistor that causes a current to flow through the solenoid is turned on and turned off at a duty ratio to flow such a current through the solenoid as to not actually drive the solenoid valve. Then, the solenoid valve is determined as being normal if the monitored current value of the current flowing through the solenoid is the same as the current value of the current that does not actually drive the solenoid valve.

SUMMARY

According to one aspect of the present disclosure, a solenoid control apparatus determines that, in a state of outputting a certain instruction duty ratio for causing a current to flow through a solenoid, the solenoid is abnormal if a detected current value of the current flowing through the solenoid falls within an abnormal range, the solenoid being used to drive a solenoid valve that controls a flow of a brake fluid; after the solenoid is determined as being abnormal, outputs a first instruction duty ratio for causing a current, having such a current value within a first normal range as to not drive the solenoid valve, to flow through the solenoid; determines that the solenoid is provisionally normal if, in a state of outputting the first instruction duty ratio, the detected current value falls within the first normal range; after the solenoid is determined as being provisionally normal, outputs a second instruction duty ratio for causing a current, having such a current value within a second normal range including a current value range greater than the first normal range as to drive the solenoid valve, to flow through the solenoid; and determines that the solenoid is normal if, in a state of outputting the second instruction duty ratio, the detected current value falls within the second normal range.

Other objects, features and advantages will become more apparent from the following detailed description when read in conjunction with the accompanying drawings.

DETAILED DESCRIPTION

Figure 1:
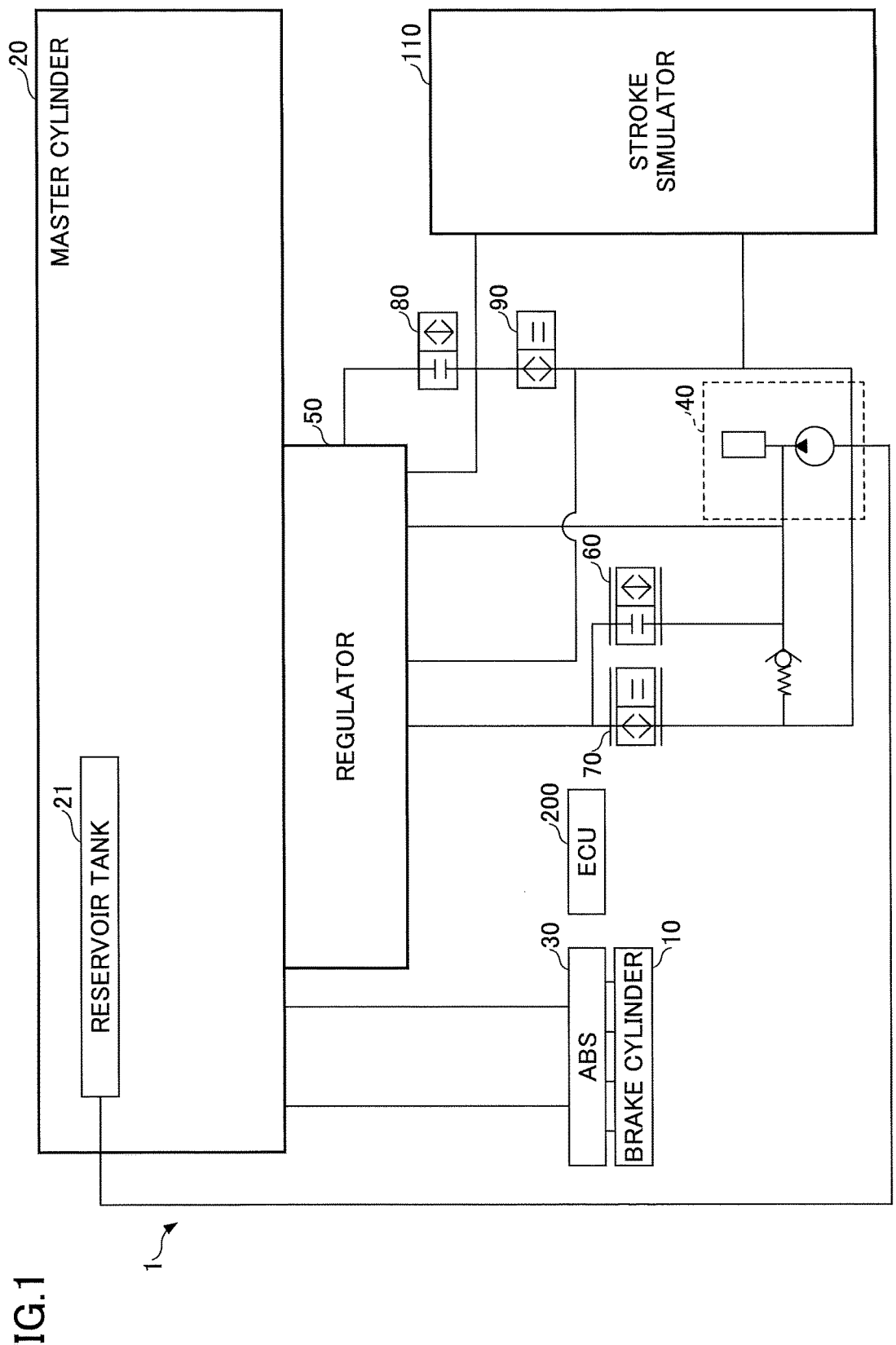
FIG. 1 illustrates one example of a configuration of a brake system.

In the related art described above, even if the solenoid is determined as being normal by causing a current of such a relatively small current value to flow through the solenoid as to not drive the solenoid valve, it is not necessarily assured that the solenoid valve normally operates with such a relatively great current value as to actually drive the solenoid valve.

Therefore, an object of an embodiment is to provide a solenoid control apparatus and a diagnosis method with which it is possible to improve the precision of solenoid normality determination.

In order to achieve the object, according to the embodiment, a solenoid control apparatus determines that, in a state of outputting a certain instruction duty ratio for causing a current to flow through a solenoid, the solenoid is abnormal if a detected current value of the current flowing through the solenoid falls within an abnormal range, the solenoid being used to drive a solenoid valve that controls a flow of a brake fluid; after the solenoid is determined as being abnormal, outputs a first instruction duty ratio for causing a current, having such a current value within a first normal range as to not drive the solenoid valve, to flow through the solenoid; determines that the solenoid is provisionally normal if, in a state of outputting the first instruction duty ratio, the detected current value falls within the first normal range; after the solenoid is determined as being provisionally normal, outputs a second instruction duty ratio for causing a current, having such a current value within a second normal range including a current value range greater than the first normal range as to drive the solenoid valve, to flow through the solenoid; and determines that the solenoid is normal if, in a state of outputting the second instruction duty ratio, the detected current value falls within the second normal range.

In the solenoid control apparatus, the solenoid is first determined as being provisionally normal if the detected current value falls within a first normal range where the solenoid valve is not driven, after the solenoid is determined as being abnormal. Then, the solenoid is determined as being normal if the detected current value falls within a second normal range, including a current value range greater than the first normal range, where the solenoid valve is driven, after the solenoid is determined as being provisionally normal. Thus, it is determined whether the solenoid is normal using the current having such a relatively small current value that the solenoid valve is not driven, and also, using the current having such a relatively great current value that the solenoid valve is driven. Thus, it is possible to improve the precision of solenoid normality determination.

Also, in the solenoid control apparatus or the diagnosis method, final normality determination is carried out after provisional normality determination is carried out. Thus, it is possible to avoid an inconvenience that a flow of a brake fluid varies due to an operation of the solenoid valve in such a stage where the solenoid has not yet been determined as normal after being determined as abnormal. That is, in order to avoid the inconvenience, such a current value as to not actually drive the solenoid valve is made to flow through the solenoid, and thus, provisional normality determination is carried out after the solenoid determined as being abnormal is replaced with another solenoid valve, or the solenoid is repaired. Then, after the solenoid is determined as provisionally normal in the provisional normality determination, such a current value as to actually drive the solenoid valve is made to flow through the solenoid, and thus, final normality determination is carried out.

According to the embodiment, a diagnosis method includes detecting a current value of a current flowing through a solenoid used to drive a solenoid valve for controlling a flow of a brake fluid; determining that the solenoid is abnormal if, in a state of outputting a certain instruction duty ratio for causing a current to flow through the solenoid, the detected current value falls within an abnormal range; after the solenoid is determined as being abnormal, outputting a first instruction duty ratio for causing a current, having such a current value within a first normal range as to not drive the solenoid valve, to flow through the solenoid; determining that the solenoid is provisionally normal if, in a state of outputting the first instruction duty ratio, the detected current value falls within the first normal range; after the solenoid is determined as being provisionally normal, outputting a second instruction duty ratio for causing a current, having such a current value within a second normal range including a current value range greater than the first normal range as to drive the solenoid valve, to flow through the solenoid; and determining that the solenoid is normal if, in a state of outputting the second instruction duty ratio, the detected current value falls within the second normal range.

Also in the diagnosis method, in the same manner as the above-mentioned solenoid control apparatus, it is determined whether the solenoid is normal using the current having such a relatively small current value that the solenoid valve is not driven, and using the current having such a relatively great current value that the solenoid valve is driven. Thus, it is possible to improve the precision of solenoid normality determination. Also, in the same manner as the above-mentioned solenoid control apparatus, it is possible to avoid an inconvenience that a flow of a brake fluid varies due to an operation of the solenoid valve in a stage where, the solenoid has not yet been determined as normal after being determined as abnormal.

Also, in the solenoid control apparatus or the diagnosis method according to the embodiment, a first warning lamp and a second warning lamp are turned on in an abnormal state where the solenoid is determined as being abnormal; the first warning lamp is turned off and the second warning lamp is turned on in a provisionally normal state where the solenoid is determined as being provisionally normal; and the first warning lamp and the second warning lamp are turned off in a normal state where the solenoid is determined as being normal.

Thus, an occupant or a worker can visually determine whether the current state of the solenoid is the abnormal state, the provisionally normal state, or the normal state.

Also, in the solenoid control apparatus or the diagnosis method according to the embodiment, the solenoid used to drive the solenoid valve may be a linear solenoid used to change an opening of the solenoid valve according to the current value of the current flowing through the solenoid in the normal state when an ignition switch is in its turned-on state. In this case, the second instruction duty ratio is output in the provisionally normal state according to a brake operation occurring during a period from when the ignition switch enters its turned-on state until the ignition switch enters its turned-off state, whereas, if no brake operation occurs, the second instruction duty ratio is output according to a predetermined pattern in the provisionally normal state after the ignition switch enters its turned-off state.

In the case where the solenoid is the above-mentioned linear solenoid, the flow of the brake fluid varies due to an operation of the solenoid valve if the second instruction duty ratio is being output. Therefore, if the second instruction duty ratio is output regardless of the user's intention, the user may feel that something may be wrong because such a phenomenon that the operational feeling of the brake pedal varies due to the variation in the brake fluid flow may suddenly occur.

Therefore, in the solenoid control apparatus or the diagnosis method, the second instruction duty ratio is output in the provisionally normal state according to a brake operation performed by the user if the brake operation occurs during a period from when the ignition switch enters the turned-on state until the ignition switch enters the turned-off state. Thus, a current is made to flow through the solenoid with a current value according to the user's brake operation. Therefore, even in the ignition switch turned-on state, it is possible to carry out final normality determination without causing the user to feel that something may be wrong. On the other hand, even if no brake operation has occurred during a period from the time of the ignition switch entering the turned-on state until the time of the ignition switch entering the turned-off state, the second instruction duty ratio is output according to a predetermined pattern in the provisionally normal state after the ignition switch enters the turned-off state. Because a current is caused to flow through the solenoid according to the predetermined pattern in the ignition switch turned-off state, it is possible to carry out final normality determination without causing the user to feel that something may be wrong.

Also, in the solenoid control apparatus or the diagnosis method according to the embodiment, the solenoid used to drive the solenoid valve may be a cut solenoid used to keep the solenoid valve in its opened state or its closed state by continuously causing a current to flow through the solenoid in the normal state when an ignition switch is in its turned-on state. In this case, the second instruction duty ratio is output in the provisionally normal state according to such a pattern as to cause a starting current to flow through the solenoid and thereafter cause a holding current smaller than the starting current to flow through the solenoid, when the ignition switch is in its turned-on state.

If the solenoid is the above-mentioned cut solenoid, the cut solenoid keeps the solenoid valve in the closed state or the opened state as a result of a current being caused to continuously flow through the solenoid when the ignition switch is in the turned-on state in a normal state where the solenoid is determined as being normal. Therefore, even if the second instruction duty ratio is output regardless of the user's intention, the user does not feel that something may be wrong because no such a phenomenon occurs that the user's operational feeling of the brake pedal may suddenly vary due to a variation in the brake fluid flow.

Therefore, the second instruction duty ratio is output according to the predetermined pattern to cause the starting current to flow through the solenoid, and then, cause the holding current smaller than the starting current to flow through the solenoid, in the provisionally normal state, when the ignition switch is in the turned-on state. Thus, in the ignition switch turned-on state, it is possible to carry out final normality determination without causing the user to feel that something may be wrong.

Accordingly, it is possible to improve the precision of solenoid normality determination.

The embodiment will now be described in more detail with reference to the accompanying drawings.

FIG. 1 illustrates one example of a configuration of a brake system. The brake system 1 illustrated in FIG. 1 is one example of a brake system installed in a vehicle, and uses a brake fluid as an operating fluid to reduce the rotation speed of vehicle wheels. The brake system 1 includes brake cylinders 10, a master cylinder 20, an ABS (Antilock Brake System) 30, an oil pressure source 40, a regulator 50, a pressure increasing linear valve 60, a pressure decreasing linear valve 70, a communication valve 80, a shutoff valve 90, a stroke simulator 110, and an ECU (Electronic Control Unit) 200.

The brake cylinders 10 are installed for the respective four wheels, and generate brake forces as a result of pressurized brake fluid being supplied to the brake cylinders 10.

The master cylinder 20, to which a driver's operation of the brake pedal is input, supplies the pressurized brake fluid to the respective brake cylinders 10.

The ABS 30 is inserted between the master cylinder 20 and the 4 brake cylinders 10 to prevent continuous locking of the wheels. The ABS 30 has a known configuration including holding valves, pressure reducing valves, pumps, pump motors, and so forth.

The oil pressure source 40 is a high-pressure source, draws up the brake fluid from a reservoir tank 21 that is a low-pressure source, and pressurizes the brake fluid to supply the high-pressure brake fluid.

The regulator 50 is a mechanical regulator to regulate the pressure of the brake fluid supplied from the oil pressure source 40, and supplies the brake fluid to the master cylinder 20.

The pressure increasing linear valve 60 and the pressure decreasing linear valve 70 are examples of solenoid valves each of which adjusts the pressure of the brake fluid supplied from the regulator 50. The pressure increasing linear valve 60 is a normally closed electromagnetic linear solenoid valve inserted between the oil pressure source 40 and the regulator 50. The greater an excitation current flowing through the linear solenoid of the pressure increasing linear valve 60 becomes, the greater the opening (i.e., the degree of valve opening from the closed state through the opened state) becomes, and the greater the opening amount becomes. The pressure decreasing linear valve 70 is a normally opened electromagnetic linear solenoid valve inserted between the regulator 50 and the reservoir tank 21. The greater an excitation current flowing through the linear solenoid of the pressure decreasing linear valve 70 becomes, the smaller the opening (i.e., the degree of valve opening from the closed state through the opened state) becomes, and the smaller the opening amount becomes.

The communication valve 80 is one example of a solenoid valve supplying the oil pressure generated by the driver's brake operation to the stroke simulator 110. The communication valve 80 is a normally closed electromagnetic cut solenoid valve inserted between the regulator 50 and the stroke simulator 110. The communication valve 80 enters the closed state in the non-excited state, and enters the opened state in the excited state.

The shutoff valve 90 is one example of a solenoid valve releasing the pressure from the stroke simulator 110 to the reservoir tank 21 in a system failure state where one or more solenoids are determined as being abnormal. The shutoff valve 90 is a normally opened electromagnetic cut solenoid valve inserted between the stroke simulator 110 and the reservoir tank 21. The shutoff valve 90 enters the opened state in the non-excited state, and enters the closed state in the excited state.

The stroke simulator 110 implements a natural pedal stroke according to the brake pedal treading force by introducing the brake fluid from the regulator 50 to a cylinder inside the stroke simulator 110.

The ECU 200 is an example of a control unit controlling operations of the pressure increasing linear valve 60, the pressure decreasing linear valve 70, the communication valve 80, the shutoff valve 90, and so forth.

Figure 2A:
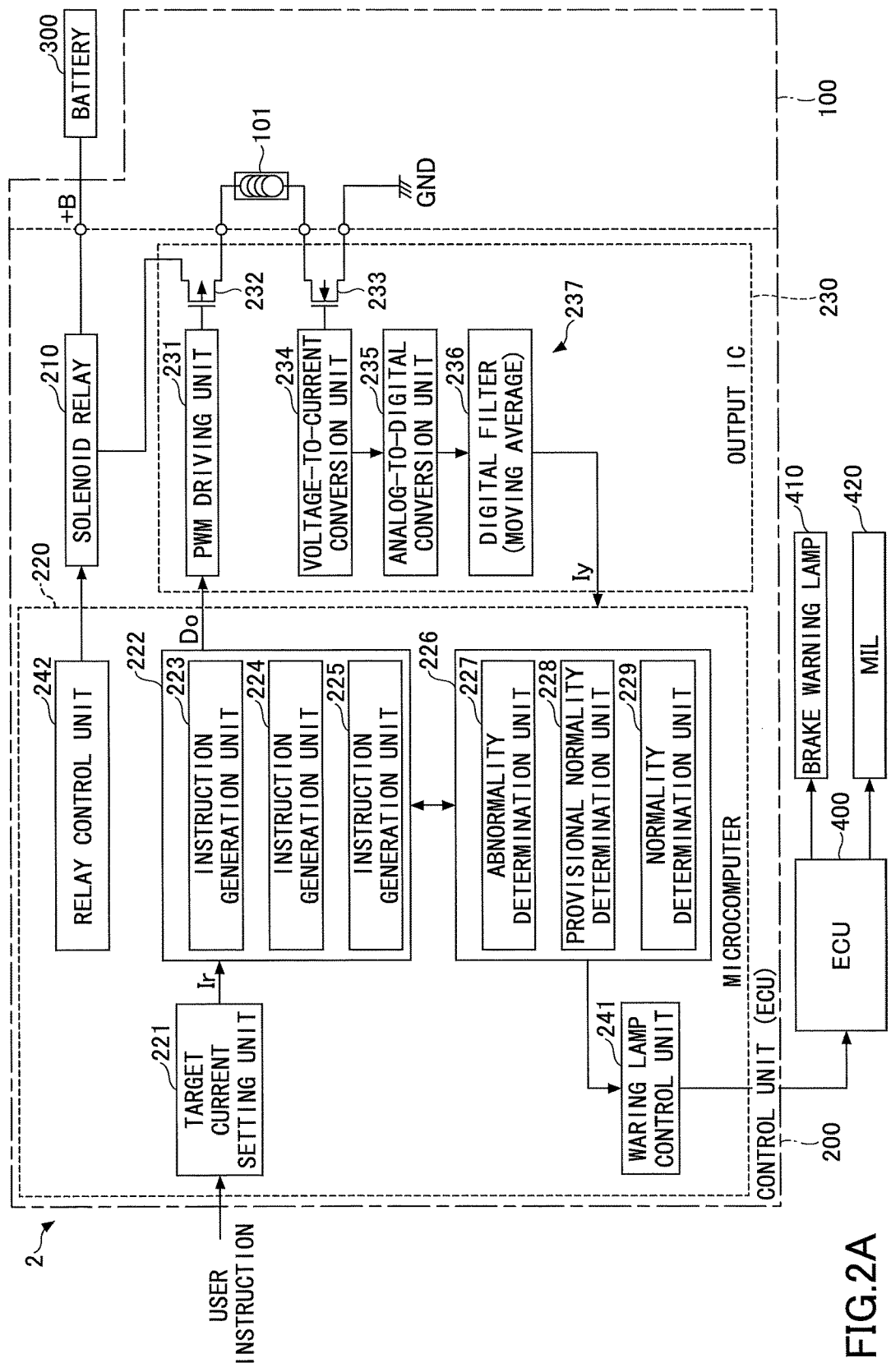
FIG. 2A illustrates one example of a configuration of a solenoid control apparatus.

FIG. 2A illustrates one example of a configuration of the solenoid control apparatus. The solenoid control apparatus 2 illustrated in FIG. 2A controls an operation of a solenoid valve 100 installed in the brake system 1. The solenoid valve 100 is one example of a solenoid valve controlling a flow of the brake fluid. The solenoid valve 100 is any one of the pressure increasing linear valve 60, the pressure decreasing linear valve 70, the communication valve 80, and the shutoff valve 90. FIG. 2A illustrates a case where a single solenoid 101 is driven. In a case where a plurality of solenoids 101 are driven, the configuration of the ECU 200 illustrated in FIG. 2A is prepared for each of the plurality of solenoids 101.

The solenoid control apparatus 2 includes the solenoid valve 100, and the ECU 200 that controls a current flowing through the solenoid 101 included in the solenoid valve 100. The solenoid valve 100 and the ECU 200 may be configured as a single unit, or configured as separate units, respectively. A battery 300 is connected to the solenoid control apparatus 2 to supply power to the solenoid 101 from a +B terminal.

The battery 300 is one example of a power source installed in the vehicle. The battery voltage of the battery 300 ordinarily varies depending on electric loads in the vehicle, the operation state of the engine, and so forth.

The solenoid 101 linearly moves a moving core inserted in a coil with electromagnetic force generated as a result of a current flowing through the coil.

The ECU 200 includes a solenoid relay 210 for breaking power supply to the solenoid 101 from the battery 300. The ECU 200 includes a microcomputer 220 and an output IC (Integrated Circuit) 230.

The microcomputer 220 generates an instruction duty ratio Do for causing a current to flow through the solenoid 101 based on a user instruction that is input as a result of the driver treading on the brake pedal. The output IC 230 causes a current to flow through the solenoid 101 according to the instruction duty ratio Do while monitoring the current flowing through the solenoid 101.

For example, if the user instruction is thus input according to the brake pedal treading-on amount or treading-on speed as a result of the brake pedal being trod on by the driver, a target current Ir to be supplied to the solenoid 101 is set in the microcomputer 220 by a target current setting unit 221 according to the user instruction.

Based on the target current Ir, the microcomputer 220 calculates the instruction duty ratio Do to drive the solenoid 101 in a PWM (Pulse-Width Modulation) fashion through a power supply instruction generation unit 222. The power supply instruction generation unit 222 outputs the instruction duty ratio Do that is corrected according to at least one of the temperature of the solenoid 101 and the voltage applied to the solenoid 101 by the battery 300, for example.

After the microcomputer 220 outputs a signal indicating the instruction duty ratio Do as a driving instruction, the output IC 230 generates driving pulses according to the instruction duty ratio Do through a PWM driving unit 231. The generated driving pulses turn on and turn off a transistor (for example, a p-channel FET) 232. Thus, the battery voltage supplied via the solenoid relay 210 is applied to the solenoid 101 in synchronization with the turning-on/off timing of the transistor 232. As a result, a current (average current) corresponding to the instruction duty ratio Do is supplied to the solenoid 101.

The current, first supplied to the solenoid 101, then flows to ground (GND) through another transistor (for example, an n-channel FET) 233 included in the output IC 230. The output IC 230 includes a current detection unit 237 configured to detect the current flowing through the solenoid 101 to drive the solenoid valve 100. The current detection unit 237 includes, for example, the transistor 233, a voltage-to-current conversion unit 234, an analog-to-digital conversion unit 235, and a digital filter 236.

In the normal state, the output IC 230 continuously turns on the transistor 233 according to an instruction signal from the microcomputer 220. The current flowing through the solenoid 101 then flows through the transistor 233 to generate the voltage in proportion to the internal resistance of the transistor 233. The generated voltage is converted into the current by the voltage-to-current conversion unit 234. The current value of the thus acquired current is quantized by the analog-to-digital conversion unit 235, and then, is converted into a moving average for each fixed period by the digital filter 236. The thus acquired moving average of the monitored current is a monitored current Iy as a monitored value of the current supplied to the solenoid 101, and is input to the microcomputer 220.

The microcomputer 220 compares the monitored current Iy with the target current Ir. Then, the microcomputer 220 generates such an instruction duty ratio Do as to rapidly cause the monitored current Iy to become equal to the target current Ir by carrying out PI control or PID control based on the comparison result through the power supply instruction generation unit 222. As a result of a feedback control system being configured by the microcomputer 220 and the output IC 230, the current that follows the target current Ir that is set based on the user's instruction flows through the solenoid 101.

The microcomputer 220 is one example of a microcomputer that includes a CPU (Central Processing Unit) and a memory.

Figure 2B:
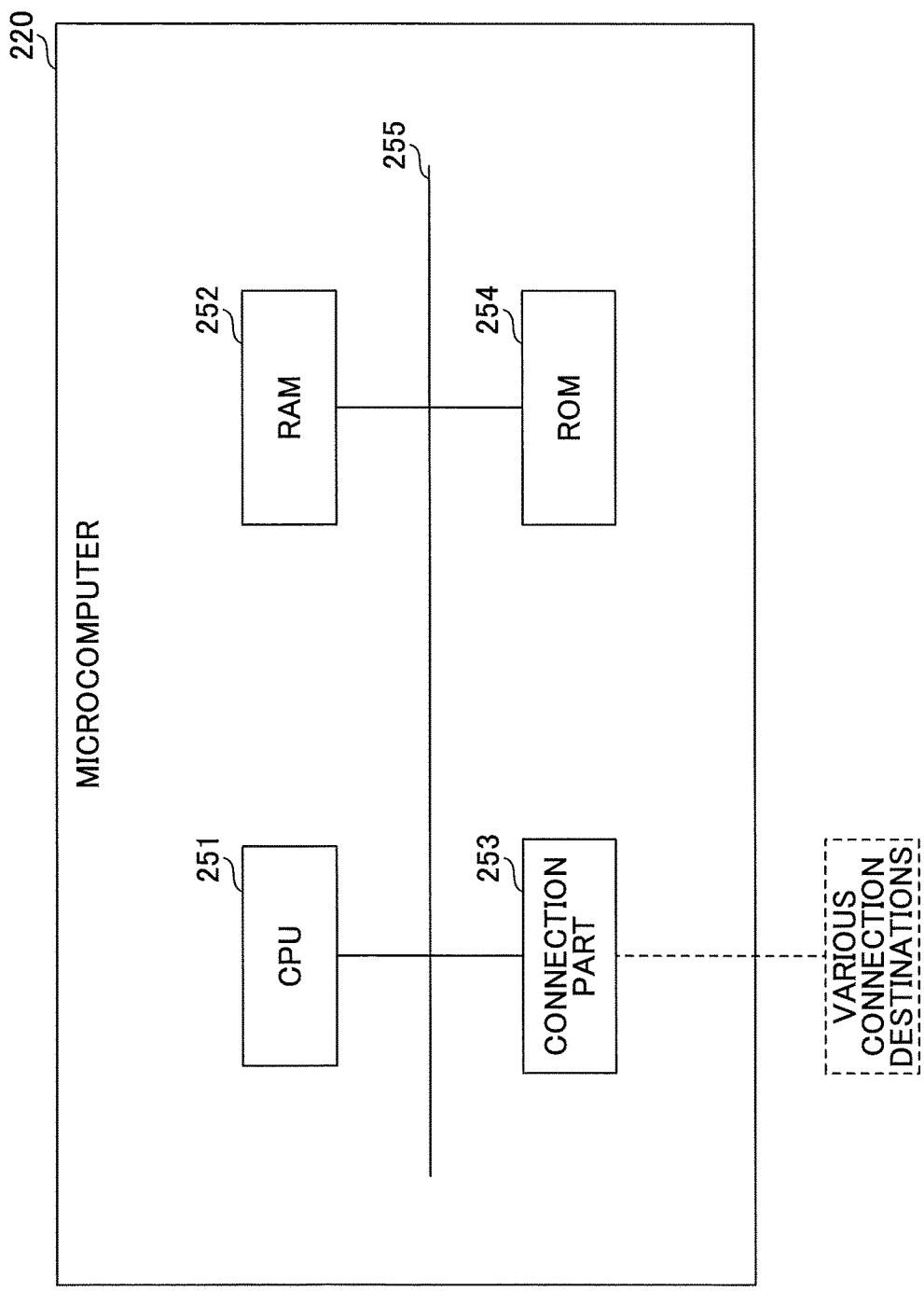
FIG. 2B illustrates one example of a hardware configuration a microcomputer illustrated in FIG. 2A.

An example of a hardware configuration of the microcomputer 220 will now be described. FIG. 2B illustrates one example of a hardware configuration of the microcomputer 220.

As illustrated in FIG. 2B, the microcomputer 220 includes a CPU 251, a RAM (Random Access Memory) 252, a connection part 253, and a ROM (Read-Only Memory) 254. These parts of the microcomputer 220 are mutually connected via a bus 255.

The CPU 251 executes a program stored in the ROM 254.

The RAM 252 is a main storage such as a DRAM (Dynamic Random Access Memory), an SRAM (Static Random Access Memory), or the like. The RAM 252 is used as a working area for storing the program stored in the ROM 254 while the program is being executed by the CPU 251. The RAM 252 is used also as a storage area for temporarily storing information acquired as a result of the program stored in the ROM 254 being executed by the CPU 251.

The connection part 253 is connected with various connection destinations such as another ECU 400, the solenoid relay 210, the PWM driving unit 231, the digital filter 236, and so forth, and acts as an interface for transmitting various sorts of information to and receiving various sorts of information from these connection destinations.

The ROM 254 is another main storage such as an EPROM, an EEPROM, or the like, and stores the program to be executed by the CPU 251 and information used when the CPU 251 executes the program.

The microcomputer 220 includes, as functional units, the target current setting unit 221, the power supply instruction generation unit 222, a determination unit 226, a warning lamp control unit 241, and a relay control unit 242. The target current setting unit 221, the power supply instruction generation unit 222, the determination unit 226, the warning lamp control unit 241, and the relay control unit 242 are implemented as a result of the CPU 251 executing the program stored in the ROM 254. The power supply instruction generation unit 222 includes instruction generation units 223, 224, and 225. The determination unit 226 includes an abnormality determination unit 227, a provisional normality determination unit 228, and a normality determination unit 229.

The instruction generation unit 223 outputs a normal instruction duty ratio as the instruction duty ratio Do to cause a current to flow through the solenoid 101 by driving the transistor 232 in such a manner as to cause the monitored current Iy to become the same as the target current Ir.

The abnormality determination unit 227 is one example of an abnormality determination unit configured to determine, if the current value detected by the current detection unit 237 falls within an abnormal range, that the solenoid 101 is abnormal. The abnormality determination unit 227 determines that the solenoid 101 is abnormal if, for example, in a state where the normal instruction duty ratio is being output, the current value detected by the current detection unit 237 falls within a certain abnormal range. An actual example of the certain abnormal range is an abnormal range 1 and an abnormal range 2 illustrated in FIG. 3 (details of which will be described later).

The instruction generation unit 224 is one example of a first instruction generation unit. In an abnormal state where the solenoid 101 is determined as being abnormal, the instruction generation unit 224 outputs a first instruction duty ratio for causing a current, having a current value within such a first normal range as to not drive the solenoid valve 100, to flow through the solenoid. The instruction generation unit 224 outputs the first instruction duty ratio as the instruction duty ratio Do, in the abnormal state. An actual example of the first normal range is a normal range 1 illustrated in FIG. 3 (details of which will be described later).

The provisional normality determination unit 228 is one example of a provisional normality determination unit configured to determine that the solenoid 101 is provisionally normal if, in a state where the first instruction duty ratio is being output, the current value detected by the current detection unit 237 falls within the first normal range.

The instruction generation unit 225 is one example of a second instruction generation unit. In a provisionally normal state where the solenoid 101 is determined as being provisionally normal, the instruction generation unit 225 outputs a second instruction duty ratio for causing a current, having a current value within such a second normal range including a current value range greater than the first normal range as to drive the solenoid valve 100, to flow through the solenoid 101. The instruction generation unit 225 outputs the second instruction duty ratio as the instruction duty ratio Do in the provisionally normal state. An actual example of the second normal range is a normal range 2 illustrated in FIG. 3 (details of which will be described later).

The normality determination unit 229 is one example of a normality determination unit configured to determine that the solenoid 101 is normal if, in a state where the second instruction duty ratio is being output, the current value detected by the current detection unit 237 falls within the second normal range.

Figure 3:
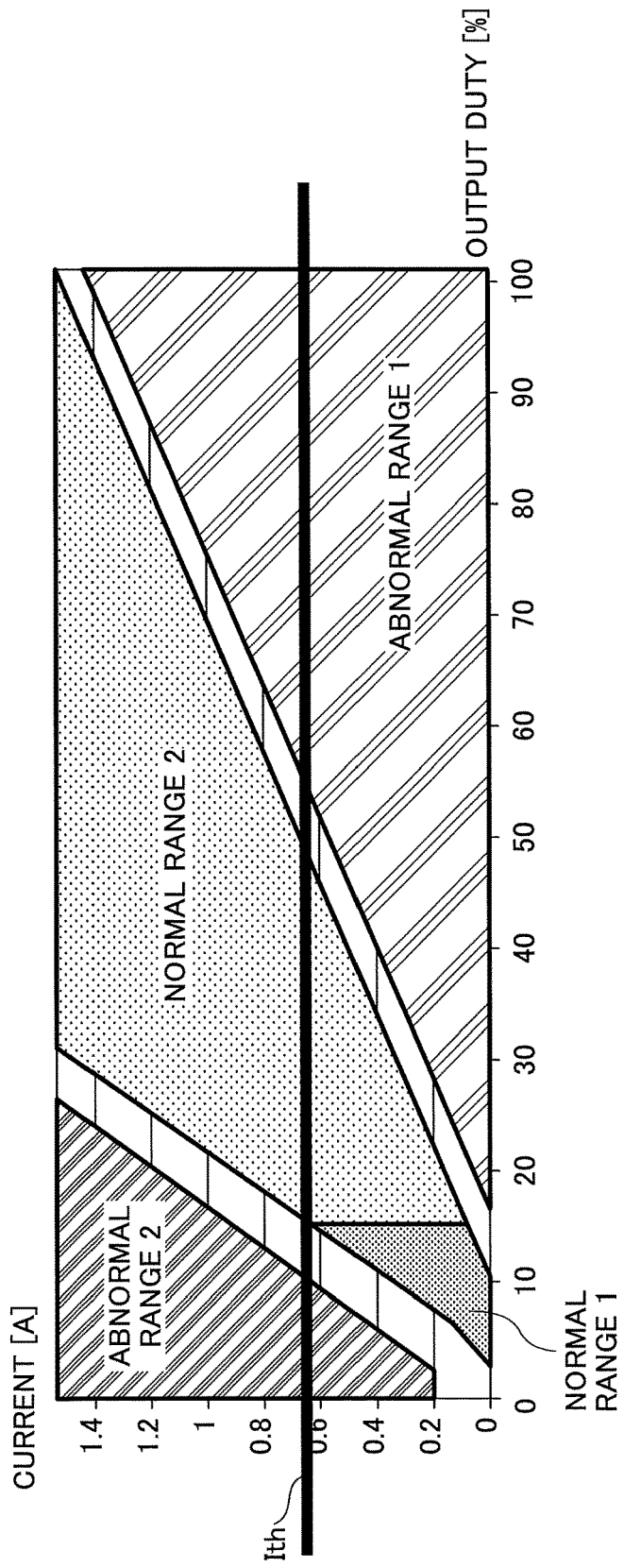
FIG. 3 illustrates one example of relationships between an instruction duty ratio and a current flowing through a solenoid when a current is caused to flow through the solenoid.

FIG. 3 illustrates one example of relationships between the instruction duty ratios and the currents flowing through the solenoid 101 when the current is made to flow through the solenoid 101. The horizontal axis "OUTPUT DUTY" represents the instruction duty ratio Do. Any of "abnormal range 1" and "abnormal range 2" represents the abnormal range. The abnormal range 1 corresponds to an abnormal state where the current flowing through the solenoid 101 is excessively smaller than a design value with respect to the instruction duty ratio Do (for example, a state where disconnection or half short circuiting occurs in the solenoid 101). The abnormal range 2 corresponds to an abnormal state where the current flowing through the solenoid 101 is excessively greater than the design value with respect to the instruction duty ratio Do (for example, a state where short circuiting or half short circuiting occurs in the solenoid 101). Any of "normal range 1" and "normal range 2" represents the normal range. The normal range 1 is one example of the first normal range where the solenoid valve 100 is not driven. The normal range 2 is one example of the second normal range, including a current value range greater than the first normal range, where the solenoid valve 100 is driven.

If a current greater than or equal to a threshold current Ith flows through the solenoid 101, the solenoid valve 100 is driven and the oil pressure varies. Therefore, during the vehicle traveling, a current greater than or equal to the threshold current Ith is not allowed to flow through the solenoid 101, unless the driver's brake operation occurs.

Figure 4:
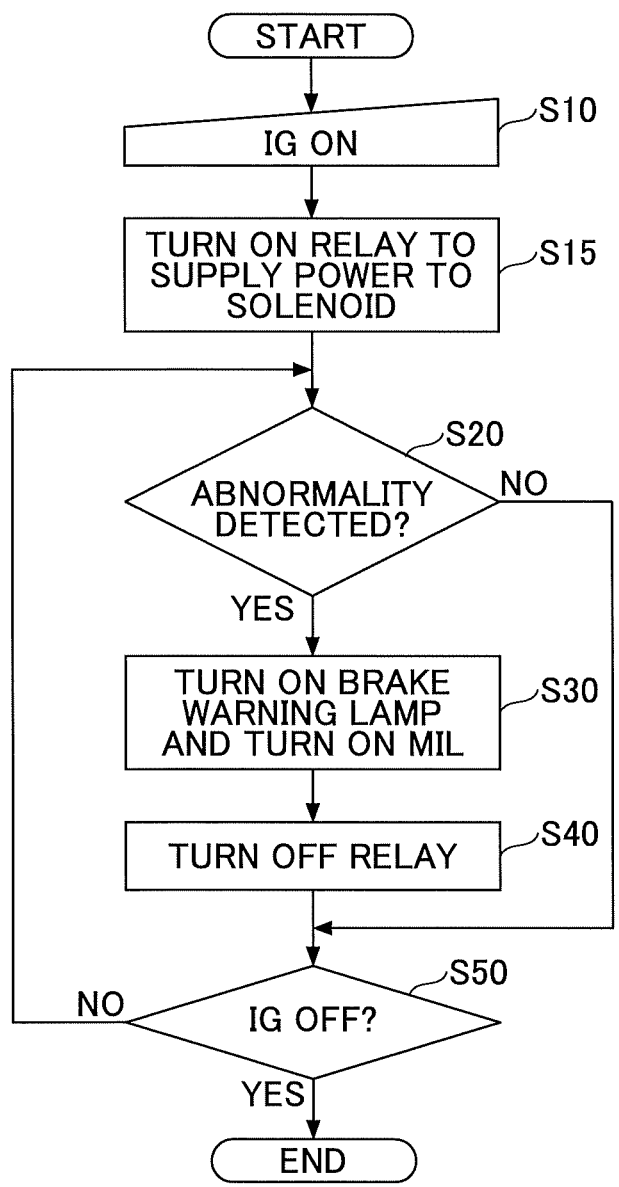
FIG. 4 is a flowchart illustrating one example of a solenoid abnormality diagnosis method.

FIG. 4 is a flowchart illustrating one example of a solenoid abnormality diagnosis method. FIG. 4 illustrates a flow of an abnormality diagnosis carried out by the microcomputer 220 of the ECU 200 when the value of a MIL turn-off counter is greater than or equal to a certain positive counter threshold (for example, "3"). If the value of the MIL turn-off counter is greater than or equal to the certain positive counter threshold, a MIL 420 is allowed to be turned off. Details of the MIL turn-off counter and the MIL 420 will be described later. With reference to FIGS. 2A and 3, each step of FIG. 4 will now be described.

When it is detected that the ignition switch is in the turned-on state, the microcomputer 220 determines whether the MIL turn-off counter value is greater than or equal to the certain positive counter threshold (Step S10). If the MIL turn-off counter value is greater than or equal to the certain positive counter threshold, the microcomputer 220 outputs a relay turning-on signal from the relay control unit 242 to turn on the solenoid relay 210 (Step S15). Thus, power can be supplied to the solenoid 101. Also, in Step S15, the microcomputer 220 outputs the normal instruction duty ratio from the instruction generation unit 223, to generate an instruction to supply power to the solenoid 101 at a current value within the normal range 1 or the normal range 2.

In Step S20, the microcomputer 220 determines whether the current value detected by the current detection unit 237 falls within the abnormal range 1 or the abnormal range 2 in the abnormality determination unit 227. The abnormality determination unit 227 does not determine that the solenoid 101 is abnormal if the current value detected by the current detection unit 237 does not fall within either the abnormal range 1 or the abnormal range 2. If the solenoid 101 is not determined as being abnormal by the abnormality determination unit 227, the microcomputer 220 carries out Step S50. The abnormality determination unit 227 determines that the solenoid 101 is abnormal if the current value detected by the current detection unit 237 falls within the abnormal range 1 or falls within the abnormal range 2. The microcomputer 220 carries out Step S30 if the solenoid 101 is determined as being abnormal by the abnormality determination unit 227.

In Step S30, the microcomputer 220 outputs a turning-on control signal from the warning lamp control unit 241 for turning on a brake warning lamp 410 and a MIL (Malfunction Indication Lamp) 420. Thus, the ECU 400 turns on the brake warning lamp 410 and the MIL 420 according to the turning-on control signal. Thus, the user can visually determine that the current state of the solenoid 101 is an abnormal state.

The brake warning lamp 410 is one example of a first warning lamp that is turned on if the solenoid 101 is in the abnormal state, is turned off if the solenoid 101 is in the provisionally normal state, and is turned off if the solenoid 101 is in the normal state. Actual examples of the brake warning lamp 410 include a red brake warning lamp, a yellow brake warning lamp, an ABS warning lamp, a slip indicator lamp, and so forth. The turned-on state of the brake warning lamp 410 means that some or all of these lamps are turned on. The turned-off state of the brake warning lamp 410 means that that all of these lamps are turned off.

The MIL 420 is one example of a second warning lamp that is turned on in the abnormal state of the solenoid 101, is turned on in the provisionally normal state of the solenoid 101, and is turned off in the normal state of the solenoid 101. An actual example of the MIL 420 is a check engine lamp.

The brake warning lamp 410 and the MIL 420 are installed in a meter installed at a front side of a driver's seat. An actual example of the ECU 400 is a meter ECU that controls indication of the meter installed at the front side of the driver's seat, or the like. It is also possible that the microcomputer 220 directly turns off and turns on the brake warning lamp 410 and the MIL 420 without using the ECU 400.

In Step S40, the microcomputer 220 turns off the solenoid relay 210 by outputting a relay turning-off signal from the relay control unit 242. Thus, supply power to the solenoid 101 is stopped. Note that Steps S30 and S40 may be carried out simultaneously, or may be carried out in the reverse order.

In Step S50, the microcomputer 220 determines whether it is detected that the ignition switch is in the turned-off state. If it is not detected that the ignition switch is in the turned-off state, the microcomputer 220 carries out Step S20. If it is detected that the ignition switch is in the turned-off state, the microcomputer 220 ends the abnormality diagnosis.

Figure 5:
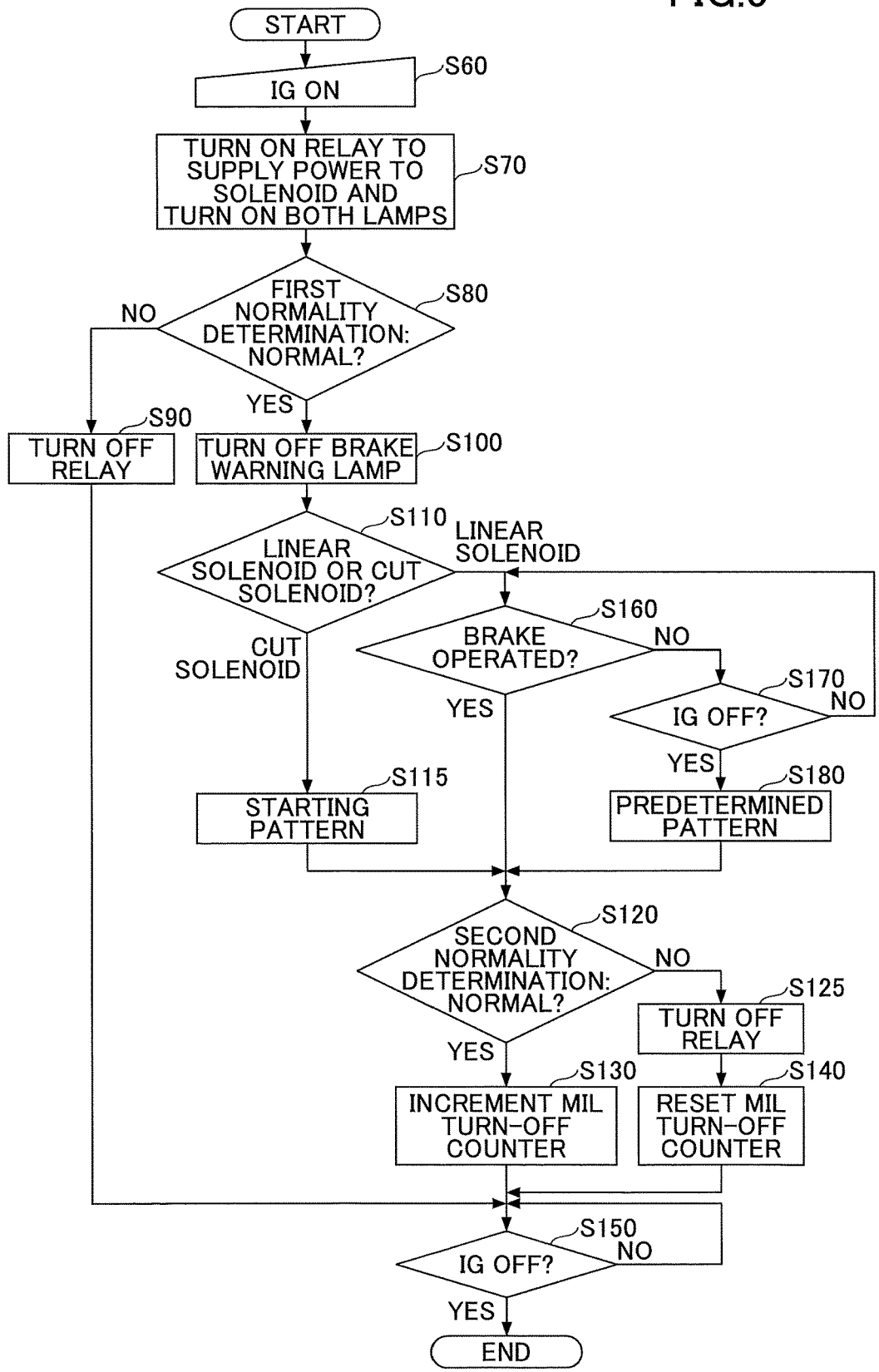
FIG. 5 is a flowchart illustrating one example of a solenoid normality diagnosis method.

FIG. 5 is a flowchart illustrating one example of a solenoid normality diagnosis method.

FIG. 5 illustrates a flow of a solenoid normality diagnosis carried out by the microcomputer 220 of the ECU 200 when the value of the MIL turn-off counter is less than the certain positive counter threshold. The details of the MIL turn-off counter will be described later. With reference to FIGS. 2A and 3, each step of FIG. 5 will now be described.

If it is detected that the ignition switch is in the turned-on state, the microcomputer 220 determines whether the MIL turn-off counter is greater than or equal to the certain positive counter threshold (Step S60). If the MIL turn-off counter is less than the certain positive counter threshold, the microcomputer 220 turns on the solenoid relay 210 by outputting a relay turning-on signal from the relay control unit 242 (Step S70). Thus, the power can be supplied to the solenoid 101. Also, in Step S70, the microcomputer 220 turns on the brake warning lamp 410 and the MIL 420 by outputting a turning-on control signal from the warning lamp control unit 241.

In Step S80, the microcomputer 220 sends an instruction to supply power to the solenoid 101 at a current value within the normal range 1 by outputting the first instruction duty ratio from the instruction generation unit 224. Then, in Step S80, during the state where the microcomputer 220 is outputting the first instruction duty ratio, the microcomputer 220 determines whether the current value detected by the current detection unit 237 falls within the normal range 1 in the provisional normality determination unit 228 (i.e., first normality determination).

In Step S80, if the current value detected by the current detection unit 237 does not fall within the normal range 1, the provisional normality determination unit 228 determines that the solenoid 101 is still in the abnormal state, and does not determine that the solenoid 101 is in the provisionally normal state. If the provisional normality determination unit 228 does not determine that the solenoid 101 is in the provisionally normal state, the microcomputer 220 turns off the solenoid relay 210 by outputting a relay turning-off signal from the relay control unit 242 (Step S90). At this time, the brake warning lamp 410 and the MIL 420 are kept in the turned-on states, respectively. The microcomputer 220 carries out Step S150 after carrying out Step S90.

On the other hand, in Step S80, if the current value detected by the current detection unit 237 falls within the normal range 1, the provisional normality determination unit 228 determines that the solenoid 101 is in the provisionally normal state. If the solenoid 101 is determined as being in the provisionally normal state by the provisional normality determination unit 228, the microcomputer 220 carries out Step S100.

In Step S100, the microcomputer 220 turns off the brake warning lamp 410 by outputting a turning-off control signal from the warning lamp control unit 241. At this time, the MIL 420 is kept in the turned-on state. Thus, the user can visually determine that the current state of the solenoid 101 is the provisionally normal state.

In Step S110, the microcomputer 220 switches an actual method to carry out normality determination depending on whether the solenoid 101 is a linear solenoid or a cut solenoid.

If the solenoid 101 is a linear solenoid included in any one of the pressure increasing linear valve 60 and the pressure decreasing linear valve 70, the microcomputer 220 carries out Step S160. The linear solenoid of the pressure increasing linear valve 60 changes the valve opening amount of the pressure increasing linear valve 60 according to the current value of a current flowing through the linear solenoid when the ignition switch is in the turned-on state, and also, the linear solenoid is in the normal state. Also, the linear solenoid of the pressure decreasing linear valve 70 changes the valve opening amount of the pressure decreasing linear valve 70 according to the current value of a current flowing through the linear solenoid when the ignition switch is in the turned-on state, and also, the linear solenoid is in the normal state.

In Step S160, the microcomputer 220 determines whether the driver's brake operation is detected. If the driver's brake operation is detected, the microcomputer 220 carries out Step S120. In this case, in Step S120, the microcomputer 220 sends an instruction to supply power to the solenoid 101 at a current value within the normal range 2 by outputting the second instruction duty ratio according to the detected brake operation from the instruction generation unit 225. Then, in Step S120, during outputting the second instruction duty ratio according to the detected brake operation, the microcomputer 220 determines whether the current value detected by the current detection unit 237 falls within the normal range 2 in the normality determination unit 229.

On the other hand, if no driver's brake operation is detected through the determination in Step S160, the microcomputer 220 carries out Step S170. In Step S170, the microcomputer 220 determines whether it is detected that the ignition switch is in the turned-off state. If it is not detected that the ignition switch is in the turned-off state, the microcomputer 220 carries out Step S160 again. If it is detected that the ignition switch is in the turned-off state, the microcomputer 220 carries out Step S180.

In Step S180, the microcomputer 220 sends an instruction to supply power to the solenoid 101 at a current value within the normal range 2 by outputting the second instruction duty ratio from the instruction generation unit 225 in a predetermined pattern. Then, in Step S120, during thus outputting the second instruction duty ratio in the predetermined pattern, the microcomputer 220 determines whether the current value detected by the current detection unit 237 falls within the normal range 2 in the normality determination unit 229.

Thus, if the driver's brake operation occurs during an interval starting from when the ignition switch enters the turned-on state until the ignition switch enters the turned-off state, the instruction generation unit 225 outputs the second instruction duty ratio according to the brake operation in the provisionally normal state. Thus, power is supplied to the solenoid 101 at the current value according to the brake operation. Therefore, even when the ignition switch is in the turned-on state, it is possible to carry out final normality determination in Step S120 without causing the user to feel that something may be wrong. Also, even if no driver's brake operation occurs during a period of time starting from when the ignition switch enters the turned-on state until the ignition switch enters the turned-off state, the instruction generation unit 225 outputs the second instruction duty ratio in the predetermined pattern in the provisionally normal state. Thus, power is supplied to the solenoid in the predetermined pattern after the ignition switch enters the turned-off state. Therefore, it is possible to carry out final normality determination in Step S120 without causing the user to feel that something may be wrong.

On the other hand, in Step S110, if the solenoid 101 is a cut solenoid included in any one of the communication valve 80 and the shutoff valve 90, the microcomputer 220 carries out Step S120 without carrying out Step S160. The cut solenoid of the communication valve 80 keeps the communication valve 80 in the opened state, as a result of power being continuously supplied to the cut solenoid, when the ignition switch is in the turned-on state, and also, the cut solenoid is in the normal state. The cut solenoid of the shutoff valve 90 keeps the shutoff valve 90 in the closed state, as a result of power being continuously supplied to the cut solenoid, when the ignition switch is in the turned-on state, and also, the cut solenoid is in the normal state.

If the solenoid 101 is the cut solenoid, the microcomputer 220 outputs the second instruction duty ratio from the instruction generation unit 225 in a pattern (i.e., a starting pattern) where, first, a starting current is made to flow through the cut solenoid, and then, a holding current smaller than the starting current is made to flow through the cut solenoid (Step S115). Then, in Step S120, during outputting the second instruction duty ratio in the starting pattern, the microcomputer 220 determines whether the current value detected by the current detection unit 237 falls within the normal range 2 in the normality determination unit 229. Thus, when the solenoid 101 is the cut solenoid, it is possible to carry out final normality determination in Step S120 without causing the user to feel that something may be wrong, when the ignition switch is in the turned-on state, without waiting for a brake operation, and also, without waiting for the ignition switch to enter the turned-off state.

In Step S120, during outputting the second instruction duty ratio, the microcomputer 220 determines whether the current value detected by the current detection unit 237 falls within the normal range 2 in the normality determination unit 229 (i.e., second normality determination).

In Step S120, if the current value detected by the current detection unit 237 does not fall within the normal range 2, the normality determination unit 229 determines that the solenoid 101 is still in the abnormal state in such a relatively high current zone as to drive the solenoid valve 100, and does not determine that the solenoid valve 100 is in the normal state. If the solenoid 101 is not determined as being in the normal state by the normality determination unit 229, the microcomputer 220 turns off the solenoid relay 210 by outputting a relay turning-off signal from the relay control unit 242 (Step S125).

Then, in Step S140, the warning lamp control unit 241 resets the MIL turn-off counter to zero. Therefore, although the brake warning lamp 410 is kept turned off, the MIL 420 is kept turned on. The microcomputer 220 carries out Step S150 after carrying out Step S140.

On the other hand, in Step S120, if the current value detected by the current detection unit 237 falls within the normal range 2, the normality determination unit 229 determines that the solenoid 101 is in the normal state. The microcomputer 220 carries out Step S130 if the solenoid 101 is determined as being in the normal state by the normality determination unit 229.

In Step S130, the warning lamp control unit 241 increments the MIL turn-off counter by one. In Step S130, if the MIL turn-off counter then has a value less than the certain positive counter threshold, the brake warning lamp 410 is kept turned off, whereas the MIL 420 is kept turned on. On the other hand, in Step S130, if the MIL turn-off counter comes to have a value greater than or equal to the certain positive counter threshold, the warning lamp control unit 241 also turns off the MIL 420. Thus, the brake warning lamp 410 and the MIL 420 are turned off together. Thus, the user can visually determine that the current state of the solenoid 101 is in the normal state.

In Step S150, the microcomputer 220 determines whether it is detected that the ignition switch is in the turned-off state. If it is determined that the ignition switch is in the turned-off state, the microcomputer 220 ends the normality diagnosis.

Thus, even if the current value is such a relatively small value as to not drive the solenoid valve 100, and also, if the current value is such a relatively great value as to drive the solenoid valve 100, it is possible to determine that the solenoid 101 is normal. Thus, it is possible to improve solenoid normality determination. Also, final normality determination is carried out after provisional normality determination. Therefore, it is possible to prevent the brake fluid flow rate from changing due to an operation of the solenoid valve 100 before the solenoid 101 is finally determined as being normal after the solenoid 101 was once determined as being abnormal.

Concerning the MIL turn-off counter, in the case where the counter threshold is, for example, "3", it is possible to turn off the MIL 420 after a determination result that the solenoid is determined as being normal in step S120 occurs successively for three trips. The warning lamp control unit 241 stores the value of the MIL turn-off counter in a nonvolatile memory inside the ECU 200. Thus, even after the ignition switch is turned off, the value of the MIL turn-off counter is held.

Figure 6:
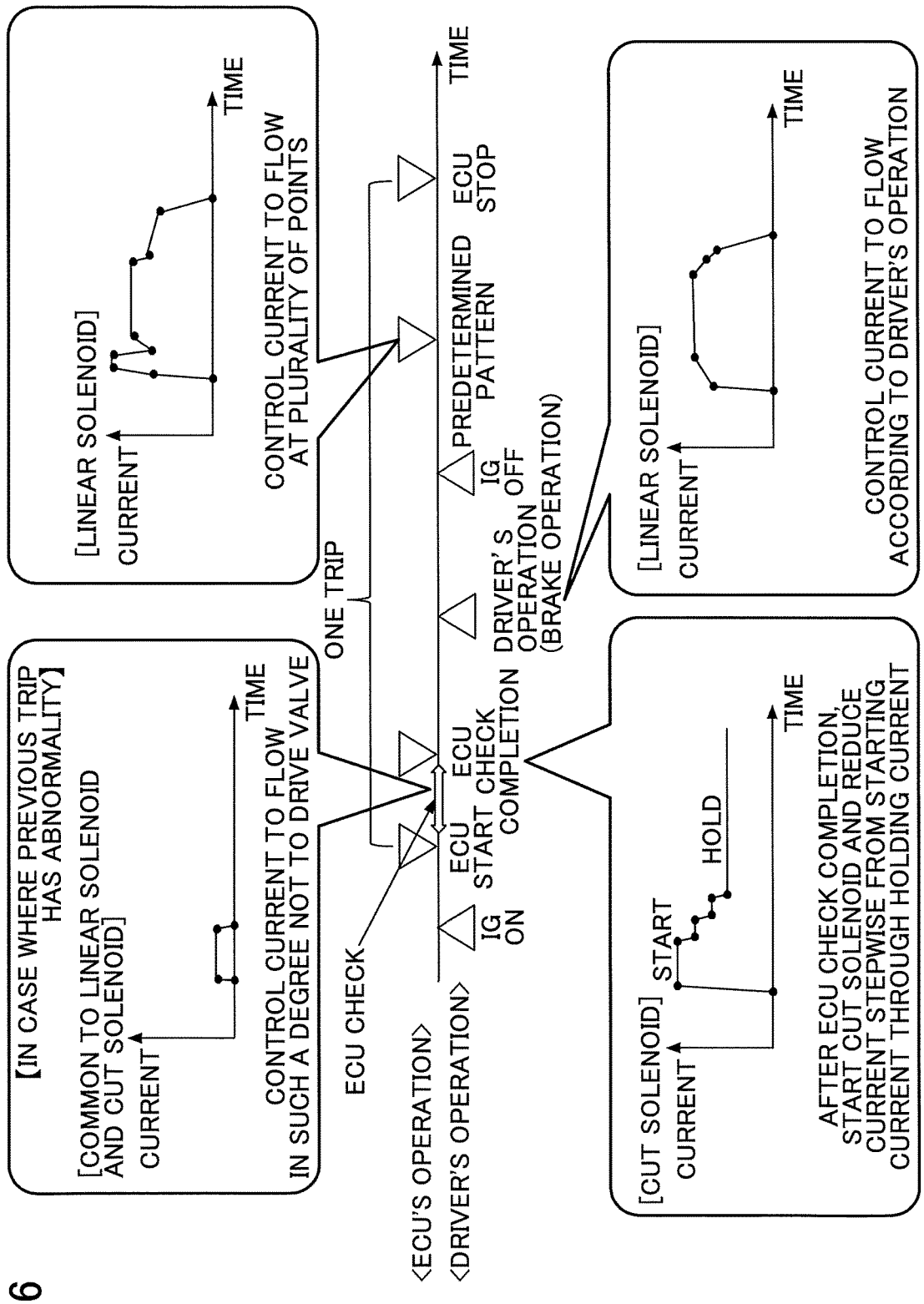
FIG. 6 is a time chart for a period from when an ignition switch is turned on until the ignition switch is turned off so that an ECU stops.

FIG. 6 illustrates one example of a time chart from when the ignition switch is turned on until the ignition switch is turned off and thereby the ECU 200 stops. When power supply to the ECU 200 is started after the ignition switch is turned on, the ECU 200 starts. A period from when the ECU 200 starts until the ECU 200 stops is referred to as one trip. After the ignition switch is turned off, the ECU 200 completes a finish process, then power supply to the ECU 200 is stopped, and the ECU 200 stops.

If a previous trip has abnormality, the microcomputer 220 carries out provisional normality determination (i.e., first normality determination in Step S80 of FIG. 5) during a period from when the ECU 200 starts until the ECU 200 completes a certain check process. In this regard, the microcomputer 220 determines that the previous trip has abnormality if the MIL turn-off counter has a value less than the certain positive counter threshold. For carrying out first normality determination, the microcomputer 220 outputs the first instruction duty ratio for supplying power to the solenoid 101 at such a current value as to not drive the solenoid valve 100.

If the solenoid 101 is the cut solenoid, the microcomputer 220 carries out second normality determination of Step S120 in FIG. 5 without waiting for an occurrence of the driver's brake operation and also without waiting for the ignition switch to enter the turned-off state, after the solenoid 101 is determined as being provisionally normal in first normality determination. In order to carry out second normality determination, the microcomputer 220 outputs the second instruction duty ratio according to the pattern (i.e., the starting pattern) to cause the starting current to flow through the cut solenoid, and then, cause the holding current smaller than the starting current to flow. Note that the cut solenoid requires a large current as the starting current for starting. However, once the cut solenoid starts, it is possible to keep the driven state of the cut solenoid by causing the holding current smaller than the starting current to flow. In the example illustrated in FIG. 6, the microcomputer 220 outputs the second instruction duty ratio according to the starting pattern where the current value is changed in a stepwise fashion from the starting current through the holding current.

On the other hand, if the solenoid 101 is the linear solenoid, the microcomputer 220 carries out second normality determination in Step S120 of FIG. 5 in a brake operation state or in the turned-off state of the ignition switch, after the solenoid 101 is determined as being provisionally normal in first normality determination.

If the driver's brake operation occurs during a period from when the ignition switch enters the turned-on state until the ignition switch enters the turned-off state, the microcomputer 220 outputs the second instruction duty ratio in the provisionally normal state according to the brake operation, for carrying out second normality determination. That is, in the example of FIG. 6, the microcomputer 220 outputs the second instruction duty ratio at a current value varying according to the driver's treading-on amount in the brake operation.

If no driver's brake operation occurs during a period from when the ignition switch enters the turned-on state until the ignition switch enters the turned-off state, the microcomputer 220 outputs the second instruction duty ratio according to the predetermined pattern in the provisionally normal state, for carrying out second normality determination. In the example of FIG. 6, the microcomputer 220 outputs the second instruction duty ratio at a current value varying in a stepwise fashion according to the predetermined pattern, after an elapse of a certain standby period after the ignition switch was turned off.

Thus, the solenoid control apparatuses and the diagnosis methods have been described in the embodiments. However, the present disclosure is not limited to these embodiments. Various modifications and improvements can be made within the scope of the present subject matter.

What is claimed is:

1. A solenoid control apparatus comprising one or more processors configured to:
   determine that a solenoid is abnormal if, in a state of outputting a certain instruction duty ratio for causing a current to flow through the solenoid, a detected current value of a current flowing through the solenoid falls within an abnormal range, the solenoid being used to drive a solenoid valve that controls a flow of a brake fluid;
   after the solenoid is determined as being abnormal, output a first instruction duty ratio for causing a current, having such a current value within a first normal range as to not drive the solenoid valve, to flow through the solenoid;
   determine that the solenoid is provisionally normal if, in a state of outputting the first instruction duty ratio, the detected current value falls within the first normal range;
   after the solenoid is determined as being provisionally normal, output a second instruction duty ratio for causing a current, having such a current value within a second normal range including a current value range greater than the first normal range as to drive the solenoid valve, to flow through the solenoid; and
   determine that the solenoid is normal if, in a state of outputting the second instruction duty ratio, the detected current value falls within the second normal range.

2. The solenoid control apparatus as claimed in claim 1, wherein
   the one or more processors are further configured to:
   turn on a first warning lamp and a second warning lamp in an abnormal state where the solenoid is determined as being abnormal;
   turn off the first warning lamp and turn on the second warning lamp in a provisionally normal state where the solenoid is determined as being provisionally normal; and
   turn off the first warning lamp and turn off the second warning lamp in a normal state where the solenoid is determined as being normal.

3. The solenoid control apparatus as claimed in claim 1, further comprising:
   the solenoid valve, wherein
   the solenoid used to drive the solenoid valve is a linear solenoid used to change an opening of the solenoid valve according to the current value of the current flowing through the solenoid in a normal state where the solenoid is determined as being normal when an ignition switch is in its turned-on state, and
   the one or more processors are further configured to output the second instruction duty ratio in a provisionally normal state where the solenoid is determined as being provisionally normal according to a brake operation occurring during a period from when the ignition switch enters its turned-on state until the ignition switch enters its turned-off state, whereas, if no brake operation occurs, output the second instruction duty ratio according to a predetermined pattern in the provisionally normal state after the ignition switch enters its turned-off state.

4. The solenoid control apparatus as claimed in claim 2, further comprising:
   the solenoid valve, wherein
   the solenoid used to drive the solenoid valve is a linear solenoid used to change an opening of the solenoid valve according to the current value of the current flowing through the solenoid in the normal state when an ignition switch is in its turned-on state, and
   the one or more processors are further configured to output the second instruction duty ratio in the provisionally normal state according to a brake operation occurring during a period from when the ignition switch enters its turned-on state until the ignition switch enters its turned-off state, whereas, if no brake operation occurs, output the second instruction duty ratio according to a predetermined pattern in the provisionally normal state after the ignition switch enters its turned-off state.

5. The solenoid control apparatus as claimed in claim 1, further comprising:
   the solenoid valve, wherein
   the solenoid used to drive the solenoid valve is a cut solenoid used to keep the solenoid valve in its opened state or its closed state by continuously supplying power to the solenoid in a normal state where the solenoid is determined as being normal when an ignition switch is in its turned-on state, and
   the one or more processors are further configured to output the second instruction duty ratio in a provisionally normal state where the solenoid is determined as being provisionally normal according to such a pattern as to cause a starting current to flow through the solenoid and thereafter cause a holding current smaller than the starting current to flow through the solenoid, when the ignition switch is in its turned-on state.

6. The solenoid control apparatus as claimed in claim 2, further comprising:
   the solenoid valve, wherein
   the solenoid used to drive the solenoid valve is a cut solenoid used to keep the solenoid valve in its opened state or its closed state by continuously supplying power to the solenoid in the normal state when an ignition switch is in its turned-on state, and the one or more processors are further configured to output the second instruction duty ratio in the provisionally normal state according to such a pattern as to cause a starting current to flow through the solenoid and thereafter cause a holding current smaller than the starting current to flow through the solenoid, when the ignition switch is in its turned-on state.

7. A diagnosis method comprising:

detecting a current value of a current flowing through a solenoid used to drive a solenoid valve for controlling a flow of a brake fluid;

determining, by one or more processors, that the solenoid is abnormal if, in a state of outputting a certain instruction duty ratio for causing a current to flow through the solenoid, the detected current value falls within an abnormal range;

after the solenoid is determined as being abnormal, outputting, by the one or more processors, a first instruction duty ratio for causing a current, having such a current value within a first normal range as to not drive the solenoid valve, to flow through the solenoid;

determining, by the one or more processors, that the solenoid is provisionally normal if, in a state of outputting the first instruction duty ratio, the detected current value falls within the first normal range;

after the solenoid is determined as being provisionally normal, outputting, by the one or more processors, a second instruction duty ratio for causing a current, having such a current value within a second normal range including a current value range greater than the first normal range as to drive the solenoid valve, to flow through the solenoid; and determining, by the one or more processors, that the solenoid is normal if, in a state of outputting the second instruction duty ratio, the detected current value falls within the second normal range.

8. The diagnosis method as claimed in claim 7, further comprising:

turning on, by the one or more processors, a first warning lamp and a second warning lamp in an abnormal state where the solenoid is determined as being abnormal;

turning off, by the one or more processors, the first warning lamp and turning on, by the one or more processors, the second warning lamp in a provisionally normal state where the solenoid is determined as being provisionally normal; and turning off, by the one or more processors, the first warning lamp and the second warning lamp in a normal state where the solenoid is determined as being normal.

9. The diagnosis method as claimed in claim 7, wherein the solenoid used to drive the solenoid valve is a linear solenoid used to change an opening of the solenoid valve according to the current value of the current flowing through the solenoid in a normal state where the solenoid is determined as being normal when an ignition switch is in its turned-on state, and the diagnosis method further comprises outputting, by the one or more processors, the second instruction duty ratio in a provisionally normal state where the solenoid is determined as being provisionally normal according to a brake operation occurring during a period starting from when the ignition switch enters its turned-on state until when the ignition switch enters its turned-off state, whereas, if no brake operation occurs, outputting, by the one or more processors, the second instruction duty ratio according to a predetermined pattern in the provisionally normal state after the ignition switch enters its turned-off state.

10. The diagnosis method as claimed in claim 8, wherein the solenoid used to drive the solenoid valve is a linear solenoid used to change an opening of the solenoid valve according to the current value of the current flowing through the solenoid in the normal state when an ignition switch is in its turned-on state, and the diagnosis method further comprises outputting, by the one or more processors, the second instruction duty ratio in the provisionally normal state according to a brake operation occurring during a period starting from when the ignition switch enters its turned-on state until when the ignition switch enters its turned-off state, whereas, if no brake operation occurs, outputting, by the one or more processors, the second instruction duty ratio according to a predetermined pattern in the provisionally normal state after the ignition switch enters its turned-off state.

11. The diagnosis method as claimed in claim 7, wherein the solenoid used to drive the solenoid valve is a cut solenoid used to keep the solenoid valve in its opened state or its closed state by continuously supplying power to the solenoid in a normal state where the solenoid is determined as being normal when an ignition switch is in its turned-on state, and the diagnosis method further comprises outputting, by the one or more processors, the second instruction duty ratio in a provisionally normal state where the solenoid is determined as being provisionally normal according to such a pattern as to cause a starting current to flow through the solenoid and thereafter cause a holding current smaller than the starting current to flow through the solenoid, when the ignition switch is in its turned-on state.

12. The diagnosis method as claimed in claim 8, wherein the solenoid used to drive the solenoid valve is a cut solenoid used to keep the solenoid valve in its opened state or its closed state by continuously supplying power to the solenoid in the normal state when an ignition switch is in its turned-on state, and the diagnosis method further comprises outputting, by the one or more processors, the second instruction duty ratio in the provisionally normal state according to such a pattern as to cause a starting current to flow through the solenoid and thereafter cause a holding current smaller than the starting current to flow through the solenoid, when the ignition switch is in its turned-on state.

* * * * *